United States Patent [19]

Van Zanten et al.

[11] Patent Number: 4,697,111
[45] Date of Patent: Sep. 29, 1987

[54] LOGIC BOATSTRAPPING CIRCUIT HAVING A FEEDFORWARD KICKER CIRCUIT

[75] Inventors: Adrianus T. Van Zanten; Hendrikus J. M. Veendrick; Leonardus C. M. G. Pfennings; Wilhelmus C. H. Gubbels, all of Eindhoven, Netherlands

[73] Assignee: U.S. Philips Corporation, New York, N.Y.

[21] Appl. No.: 698,999

[22] Filed: Feb. 7, 1985

[30] Foreign Application Priority Data

Feb. 20, 1984 [NL] Netherlands ............... 8400523

[51] Int. Cl.$^4$ ............... H03K 4/58; H03K 17/10; H03K 17/04; H03K 19/017
[52] U.S. Cl. ............... 307/482; 307/578; 307/450; 307/443
[58] Field of Search ............... 307/443, 451, 452, 453, 307/576, 579, 583, 585, 482, 578, 446, 450

[56] References Cited

U.S. PATENT DOCUMENTS

| 3,946,245 | 3/1976 | McClaughry | 307/482 |
| 4,042,838 | 8/1977 | Street et al. | 307/482 |
| 4,071,783 | 1/1978 | Knepper | 307/482 |
| 4,176,289 | 11/1979 | Leach et al. | 307/246 X |
| 4,443,715 | 4/1984 | Fox | 307/482 |

FOREIGN PATENT DOCUMENTS

| 0045133 | 2/1982 | European Pat. Off. | 307/482 |
| 0016424 | 1/1984 | Japan | 307/482 |

OTHER PUBLICATIONS

Gabric et al., "MOSFET Self-Bootstrapping Inverter Driver Circuit", IBM Tech. Discl. Bull., vol. 24, No. 10, pp. 5055-5056, Mar. 1982.

Primary Examiner—Stanley D. Miller
Assistant Examiner—David R. Bertelson
Attorney, Agent, or Firm—Robert T. Mayer; Steven R. Biren

[57] ABSTRACT

An integrated logic circuit includes a push-pull amplifier stage, in which by means of a bootstrap circuit the potential at the gate of the "push" transistor is brought above the supply voltage so that the output voltage of the amplifier lies above the supply voltage minus the threshold voltage of the push transistor. In order to prevent the charge from leaking away after the bootstrap capacitance has been charged via an enhancement transistor, the enhancement transistor is cut off by means of the "low" input signal. A second bootstrap circuit (between the input and the gate of the enhancement transistor) ensures that the first bootstrap capacitance is charged up to the full supply voltage because the latter gate electrode is lifted above the supply voltage by the second bootstrap.

4 Claims, 5 Drawing Figures

LOGIC BOATSTRAPPING CIRCUIT HAVING A FEEDFORWARD KICKER CIRCUIT

BACKGROUND OF THE INVENTION

The invention relates to an integrated circuit having insulated gate field effect transistors, this circuit comprising first and second inverting amplifiers, the first amplifier comprising first and second transistors which are connected in series between a first and a second supply terminal and are controlled in phase opposition, a junction between the first and the second transistor being connected via a first capacitance to the gate electrode of the first transistor, which gate electrode is further connected to an output of the second amplifier, the gate electrode of the second transistor being connected to a gate electrode of a third transistor of the second amplifier receiving an input signal.

Such a logic circuit is known from I.E.E.E. Journal of Solid State Circuits, Vol. SC-16, No. 3, June 1981, p. 187-8, in which the second amplifier included in the circuit is connected via a transistor of the depletion type to the supply voltage $V_{DD}$ and via the gate electrode of this transistor to an input of the circuit. At a "high" input signal, the capacitance in the feedback circuit is charged from the output of the first amplifier (which provides a "low" signal) to the gate electrode of the first transistor of this amplifier via the transistor of the depletion type. When the input signal varies from "high" to "low", the output signal of the first amplifier varies from "low" to "high", while due to the capacitive feedback (bootstrapping) to the gate electrode of the first transistor thereof the output signal becomes equal to the supply voltage ($V_{DD}$) or lies above the supply voltage $V_{DD}$ minus the threshold voltage of the first transistor ($V_{TH}$). Due to the "low" input signal, the transistor of the depletion type would have to be fully cut off. This transistor remains slightly conducting, however, so that the capacitive feedback does not operate to the optimum.

SUMMARY OF THE INVENTION

The invention has for its object to provide a logic circuit in which the capacitive feedback is fully utilized and in which the potential obtained via capacitive feedback and exceeding the supply voltage is so stable (constant) that this potential can be utilized as a control signal for further circuits.

The integrated logic circuit according to the invention is for this purpose characterized in that the second amplifier is connected via a fourth transistor to a first supply terminal, the gate electrode of this transistor being connected on the one hand via a fifth transistor connected as a diode to the first input terminal and on the other hand via a second capacitance to the gate electrodes of the second and third transistors, the first, second, third, fourth and fifth transistors being of the enhancement type.

BRIEF DESCRIPTION OF THE DRAWING

The invention will be described with reference to the embodiments shown in the drawing, in which.

DESCRIPTION OF THE PREFERRED EMBODIMENTS

Figure 1:
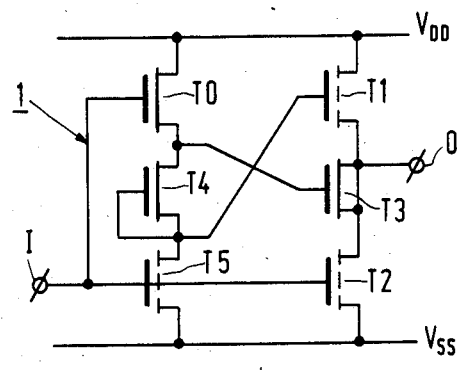
FIG. 1 shows a logic circuit according to the prior art.

In FIG. 1, a logic circuit 1 comprising insulated gate field effect transistors according to the prior art is shown, which has an inverting amplifier (a so-called push-pull output stage) comprising a first and a second transistor $T_1$ and $T_2$, which are connected in series between a first and a second supply terminal $V_{DD}$ and $V_{SS}$. The output O is fed back through a transistor $T_3$ connected as a capacitance to the gate electrode of the transistor $T_1$ via a transistor $T_4$ connected as a load and forming part of a second inverting amplifier comprising the transistors $T_4$ and $T_5$. The gate electrodes of the transistors $T_2$ and $T_5$ are interconnected and receive an input signal which is supplied to the input I. The gate electrode of the transistor $T_4$ is connected to its source electrode (the junction between the transistors $T_4$ and $T_5$) and to the gate electrode of the first transistor $T_1$. The junction between the gate electrode of the transistor $T_3$ and the transistor $T_4$ is connected via a transistor $T_0$ to the supply voltage terminal $V_{DD}$, the gate electrode of the transistor $T_0$ being connected to the input terminal I. The transistors $T_1$, $T_2$ and $T_5$ are of the enhancement type and the transistors $T_3$, $T_4$ and $T_0$ are of the depletion type.

The circuit operates as follows. When the input signal at the input terminal I is "high", the transistors $T_2$ and $T_5$ will be conducting. The potential at the gate electrode of the transistor $T_1$ is "low" so that the latter will be cut off. The output signal at the output O is consequently "low". Since the transistor $T_0$ is also conducting, the capacitance formed from the transistor $T_3$ will be charged. When the input signal becomes "low", the transistors $T_5$ and $T_2$ will be cut off. The potential increase at the gate electrode of the transistor $T_1$ thus obtained will cause the transistor $T_1$ to become conducting. The The voltage increase at the output O then obtained leads through the capacitive feedback via the transistor $T_4$ to an increased potential at the gate electrode of the transistor $T_1$, which can now be driven so far that the output voltage will assume a value equal to the voltage $V_{DD}$ or at least above the voltage $V_{DD}-V_{TH1}$ ($V_{TH1}$ is the threshold voltage of the transistor $T_1$). If in this condition the transistor $T_0$ should be fully cut off, (the latter receives a "low" signal) this condition would be retained. The transistor $T_0$ is of the depletion type, however, and it therefore cannot be made fully non-conducting so that the charge stored at the capacitance ($T_3$) leaks away, as a result of which the output voltage at the terminal O will slowly decrease to the value $V_{DD}-V_{TH1}$, which is not desirable for a voltage by which further logic circuits have to be controlled.

Figure 2:
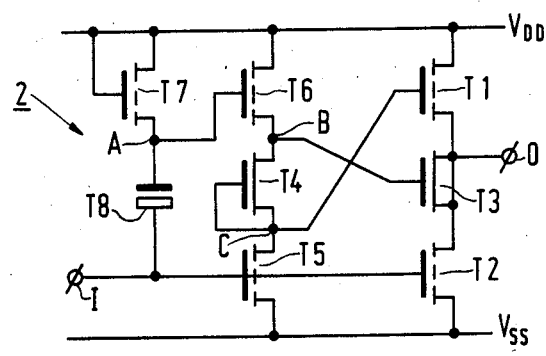
FIG. 2 shows an embodiment of a circuit according to the invention.
Figure 5:
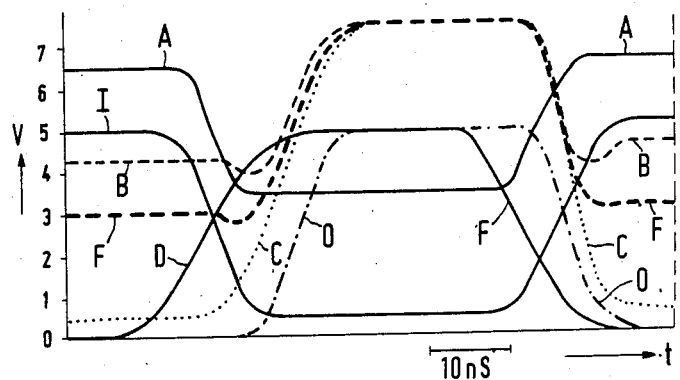
FIG. 5 shows a time-voltage diagram of voltages occurring in the circuits shown in FIGS. 3 and 4.

FIG. 2 shows an embodiment of a circuit 2 according to the invention, in which the disadvantage explained with reference to FIG. 1 does not occur. The identical components in FIGS. 1, 2 and following Figures have the same reference numerals for the sake of clarity. In FIG. 2, the transistor $T_0$ of the depletion type (FIG. 1) is replaced by a transistor $T_6$ of the enhancement type, of which the gate electrode is connected on the one hand via a transistor $T_7$ (of the enhancement type) connected as a diode to the supply voltage terminal $V_{DD}$ and on the other hand via a transistor $T_8$ (of the depletion type) connected as a capacitance to the input terminal T. If the input signal at the input I is "low" (O), the point A (see FIG. 5) is charged to a voltage value $V_{DD}-V_{TH7}$ ($V_{TH7}$ is the threshold voltage of the transistor $T_7$). When the input signal becomes "high", the output signal at the output O becomes "low" and the capacitance $T_3$ is recharged ($T_5$, $T_2$ and $T_6$ are conducting), the point B (see FIG. 5) being charged to at most $V_{DD}$. The point A is in fact brought to a potential higher than $V_{DD}$ due to the charged capacitance $T_8$ present. The point A will not be discharged because the transistor $T_7$ will be in the cut-off condition. The voltage at its source electrode is in fact higher than the voltage at its gate electrode.

When the input signal becomes "low" the transistor $T_2$ and $T_5$ will be cut off and the potential at the gate electrode (point C, see FIG. 5) of the transistor $T_1$ increases so that the voltage at the output terminal O will rise. Via the bootstrap effect of the capacitance $T_3$, the voltage at the point B will be increased to above $V_{DD}$. Since the transistor $T_6$ now receives a voltage A at its gate electrode, which is considerably lower than the voltage at at its source electrode (connected to point B), the transistor $T_6$ will be fully cut off. The point B consequently cannot be discharged, as a result of which the circuit 2 supplies at the terminal O a desired output voltage, which is constant and is (substantially) equal to the supply voltage $V_{DD}$.

Figure 3:
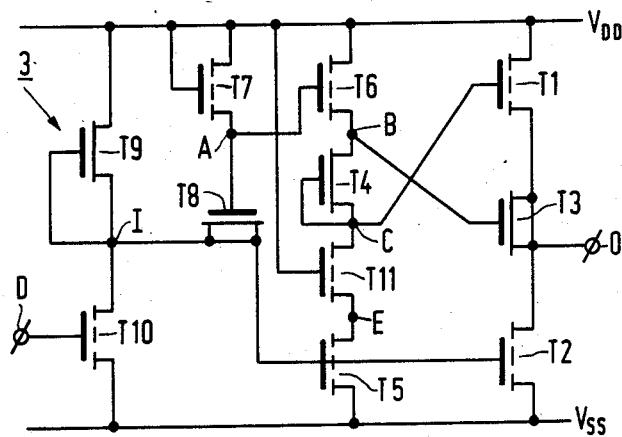
FIG. 3 shows a preferred embodiment of a circuit according to the invention.

FIG. 3 shows a preferred embodiment of a logic circuit 3 according to the invention. The input signal is supplied via a known inverting circuit comprising a transistor $T_{10}$ of the enhancement type receiving the input signal D (see FIG. 5) and a transistor $T_9$ of the depletion type connected as a load. Due to the use of so-called bootstrap techniques, the voltage at the point B is increased to above the supply voltage $V_{DD}$. In the case in which $V_{DD}$ is 5 V, the voltage at the point B can increase to 7 to 8 V. In order to avoid the voltage across the transistor $T_5$ becoming considerably larger than 5 V, which would mean that, due to a then-occurring high field strength at the drain electrode of the transistor $T_5$, there is a considerable risk of the occurrence of so-called "hot electron degradation", a further transistor $T_{11}$ is connected between the point C and the transistor $T_5$. The transistor $T_{11}$ is of the enhancement type, while its gate electrode is connected to the supply voltage $V_{DD}$ so that the transistor $T_{11}$ is in the conductive state only as long as a voltage smaller than or equal to the voltage $V_{DD}$ minus the threshold voltage $V_{TH11}$ of the transistor $T_{11}$ is applied to the point E ($V_{DD}-V_{TH11} \approx 3.5$ V).

Figure 4:
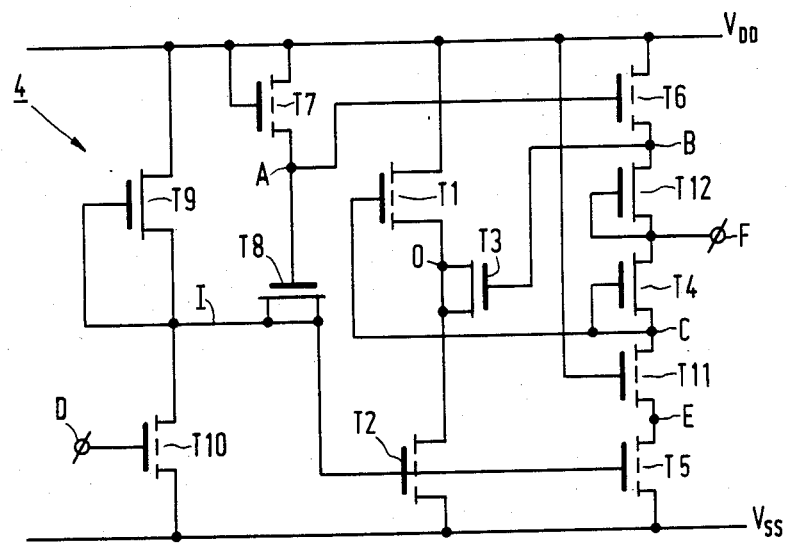
FIG. 4 shows a further embodiment of a circuit according to the invention.

FIG. 4 shows a further embodiment of a circuit 4 according to the invention, in which the circuit 4 differs from the circuit 3 in the following respects:

(a) a further transistor $T_{12}$ of the depletion type connected as a load is arranged between the transistors $T_6$ and $T_4$;

(b) The junction F between the transistors $T_4$ and $T_{12}$ serves as an output. The signal produced at F (see FIG. 5) has a (permanently constant) maximum value of ±7.5 V ($V_{DD} \approx 5$ V, $V_{ss}=0$), which is attained by the use of the bootstrap technique ($T_6$ is cut off) and a maximum value which is adjustable by the choice of the size ratio of the transistors $T_4$ and $T_{12}$. Such a signal F may be used, for example, as a reset signal for a differential amplifier in a memory (for example a CCD memory), in which both inputs of the differential amplifier are connected via a (reset) transistor to a supply line (5 V). The reset transistors are controlled by the signal F. The two inputs are fully charged up to the supply voltage because of the high level of the signal F and are prepared for a next working stroke to detect the difference between a reference signal and a supplied information signal. The low level (for example 3 V) of the signal F is determined by the maximum voltages then occurring at the inputs of the amplifier, the signal F being chosen preferably 0.5 V lower than an occurring maximum in order that the reset transistors remain fully cut off.

What is claimed is:

1. An integrated logic circuit comprising insulated gate field effect transistors, each of said transistors having a source, a gate and a drain electrode, said circuit having first and second inverting amplifiers each having an input and an output, the first amplifier comprising first and second transistors which are connected in series between a first and a second supply terminal and are controlled in phase opposition, a first capacitance, a junction between the first and the second transistors being coupled to the second inverting amplifier by said first capacitance, said gate electrode of the first transistor being connected to the output of the second amplifier, a third transistor, the gate electrode of the second transistor being connected to the gate electrode of the third transistor associated with the second amplifier and receiving an input signal, and a fourth transistor, characterized in that the second amplifier is connected by the fourth transistor to a first supply terminal, and a fifth transistor and a second capacitance, the gate electrode of the fourth transistor being connected by said fifth transistor, which is connected as a diode, to the first supply terminal and is also connected by said second capacitance to the gate electrodes of the second and third transistors, the first, second, third, fourth and fifth transistors being of the enhancement type.

2. An integrated logic circuit as claimed in claim 1, characterized in that the second capacitance comprises a transistor of the depletion type, whose source and drain electrodes are connected to the gate electrodes of the second and third transistors.

3. An integrated logic circuit as claimed in claim 1 or 2, further comprising a sixth transistor of the enhancement type, characterized in that the third transistor is connected in series with said sixth transistor, the gate electrode of the sixth transistor being connected to the first supply terminal.

4. An integrated circuit as claimed in claim 3, further comprising seventh and eighth transistors of the depletion type, characterized in that the fourth transistor is connected to the sixth transistor by said seventh and eighth transistors connected as a load, an electrode of the first capacitance being connected to a junction between the fourth and the eighth transistors, a junction between the seventh and the eighth transistors constituting the output of the second inverting amplifier and the gate electrode of the first transistor being connected to a junction between the sixth and the seventh transistors and to the gate electrode of the seventh transistor.

* * * * *

UNITED STATES PATENT AND TRADEMARK OFFICE
CERTIFICATE OF CORRECTION

PATENT NO. : 4,697,111
DATED : September 29, 1987
INVENTOR(S) : Adrianus T. Van Zanten et al It is certified that error appears in the above-identified patent and that said Letters Patent is hereby corrected as shown below:

IN THE TITLE

Change "Boatstrapping" to --Bootstrapping--

IN THE CLAIMS

Claim 1, line 11    delete "electrode"

line 12    after "second" insert

--inverting--

Signed and Sealed this

Seventh Day of May, 1991

*Attest:*

HARRY F. MANBECK, JR.

*Attesting Officer*    *Commissioner of Patents and Trademarks*